(12) United States Patent
Campbell et al.

(10) Patent No.: US 7,779,372 B2
(45) Date of Patent: Aug. 17, 2010

(54) CLOCK GATER WITH TEST FEATURES AND LOW SETUP TIME

(75) Inventors: Brian J. Campbell, Cupertino, CA (US); Shaishav Desai, Sunnyvale, CA (US); Edgardo F. Klass, Palo Alto, CA (US); Pradeep R. Trivedi, Sunnyvale, CA (US); Sridhar Narayanan, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 552 days.

(21) Appl. No.: 11/627,646

(22) Filed: Jan. 26, 2007

(65) Prior Publication Data

US 2008/0180159 A1    Jul. 31, 2008

(51) Int. Cl.
   *G06F 17/50* (2006.01)
(52) U.S. Cl. ............................................. 716/1
(58) Field of Classification Search .................. 716/1, 716/5, 6; 327/365, 386–393, 434
See application file for complete search history.

(56) References Cited

U.S. PATENT DOCUMENTS

| | | | |
|---|---|---|---|
| 3,982,138 A * | 9/1976 | Luisi et al. | ..................... 326/97 |
| 4,061,933 A | 12/1977 | Schroeder et al. | |
| 5,459,736 A | 10/1995 | Nakamura | |
| 5,689,517 A | 11/1997 | Ruparel | |
| 5,748,015 A | 5/1998 | Tam | |

(Continued)

FOREIGN PATENT DOCUMENTS

EP    522413    1/1993

OTHER PUBLICATIONS

Stepahny, et al., FP 15.5: A 200 MHz 32b 0.5W CMOS RISC Microprocessor, Digital Semiconductor, Austin, TX IEEE, 1998, pp. 15.5-1-15.5-9.

(Continued)

*Primary Examiner*—Vuthe Siek
(74) *Attorney, Agent, or Firm*—Lawrence J. Menkel; Meyertons, Hood, Kivlin, Kowert & Goetzel, P.C.

(57) ABSTRACT

A clock gater circuit comprises a plurality of transistors having source-drain connections forming a stack between a first node and a supply node. A given logical state on the first node causes a corresponding logical state on an output clock of the clock gater circuit. In one embodiment, a first transistor of the plurality of transistors has a gate coupled to receive an enable input signal. A second transistor is connected in parallel with the first transistor, and has a gate controlled responsive to a test input signal to ensure that the output clock is generated even if the enable input signal is not in an enabled state. In another embodiment, the plurality of transistors comprises a first transistor having a gate controlled responsive to a clock input of the clock gater circuit and a second transistor having a gate controlled responsive to an output of a delay circuit. The delay circuit comprises at least one inverter, wherein an input of the delay circuit is the clock input, and wherein a first inverter of the delay circuit is coupled to receive a test input signal and is configured to force a first logical state on an output of the first inverter responsive to an assertion of the test input signal.

15 Claims, 3 Drawing Sheets

U.S. PATENT DOCUMENTS

| | | | |
|---|---|---|---|
| 5,815,725 | A | 9/1998 | Feierbach |
| 5,831,462 | A | 11/1998 | Witt et al. |
| 5,838,179 | A | 11/1998 | Schmidt |
| 6,223,282 | B1 | 4/2001 | Kang |
| 6,247,134 | B1 | 6/2001 | Sproch et al. |
| 6,272,667 | B1 | 8/2001 | Minami et al. |
| 6,297,670 | B1 | 10/2001 | Chao et al. |
| 6,318,911 | B1 | 11/2001 | Kitahara |
| 6,411,152 | B1 | 6/2002 | Dobberpuhl |
| 6,529,044 | B2 * | 3/2003 | Bailey ................ 326/93 |
| 6,535,036 | B1 | 3/2003 | Dobberpuhl |
| 6,618,283 | B2 | 9/2003 | Lin |
| 6,625,242 | B1 | 9/2003 | Yoo et al. |
| 6,784,715 | B2 | 8/2004 | Campbell |

OTHER PUBLICATIONS

Santhanam, et al., SA 116: A Low-Cost 300 MHz RISC CPU with Attached Media Processor, Digital Equipment Corp., Palo Alto, CA, IEEE, 1998, pp. 18.6-1 to 18.6-9.

Montanaro, et al., "A 160-MHz, 32-b, 0.5-W CMOS RISC Microprocessor," IEEE Journal of Solid-State Circuits, vol. 31, No. 11, Nov. 1996, 12 pages.

Weiss, et al., "The On-Chip 3MB Subarray Based 3rd Level Cache on an Itanium Microprocessor," IEEE, ISSCC 2002, Session 6, 3 pages.

Josepheson, et al., "Test Methodology for the McKinley Processor," IEEE, ITC International Test Conference, Paper 21.1., 2001, pp. 578-585.

Santhanam, et al., "A 1GHz Power Efficient Single Chip Multiprocessor System For Broadband Networking Applications", Broadcom Corporation, Jun. 14, 2001, 4 pages.

P.A. Semi, "The PWRficient Processor Family," pp. 1-31, Oct. 2005.

* cited by examiner

CLOCK GATER WITH TEST FEATURES AND LOW SETUP TIME

BACKGROUND

1. Field of the Invention

This invention is related to the field of digital integrated circuits and, more particularly, to clock gating in integrated circuits.

2. Description of the Related Art

As electronic circuits, and particularly integrated circuits, increase in density, power consumption also increases. Power management circuitry is often implemented in integrated circuits to reduce power consumption. For example, power management circuitry can be used to selectively and/or temporarily remove power from a portion or all of an electronic circuit during times that the portion is inactive. Alternatively or in addition, power management circuitry can include conditional clocking circuitry (also known as clock gating circuitry or a clock gater).

Conditional clocking generally includes conditionally generating a clock to a functional circuit dependent on whether or not the functional circuit is active. If the circuit is active, the clock is generated (e.g. rising and falling edges are generated providing a high phase and a low phase of the clock signal). If the circuit is inactive, the clock is inhibited (e.g. held in a constant state, high or low, instead of toggling). Inhibiting the clock during idle times for the functional circuit results in power savings since the state of the circuit is held steady and thus the circuit experiences minimal switching activity. Typically, an enable input to the conditional clock circuitry controls whether the clock is generated or inhibited. The clock can also be inhibited even if the functional circuitry is active, in order to decrease power consumption.

The timing constraints on the enable input to the clock gater are often challenging. For example, an AND gate may be used to generate a conditional clock (with one input being the input clock and the other being the enable signal). In this case, the setup time for the enable signal is relatively short, but the hold time is approximately one half clock cycle (since the enable signal is required to remain valid, either high or low, for an entire phase of the input clock along with margin on each side to ensure glitch-free operation). As another example, an AND gate with a passgate latch on the enable signal input can be used. While the hold time may be shorter than the single AND gate (e.g. approximately the hold time of the passgate latch), the setup time is lengthened since the enable signal must propagate through the passgate latch prior to the rising edge of the input clock.

SUMMARY

In one embodiment, a clock gater circuit comprises a plurality of transistors having source-drain connections forming a stack between a first node and a supply node. A given logical state on the first node causes a corresponding logical state on an output clock of the clock gater circuit. A first transistor of the plurality of transistors has a gate coupled to receive an enable input signal. A second transistor is connected in parallel with the first transistor, and the second transistor has a gate controlled responsive to a test input signal to ensure that the output clock is generated even if the enable input signal is not in an enabled state. An integrated circuit comprising one or more of the clock gater circuits is also contemplated.

In an embodiment, a clock gater circuit comprises a plurality of transistors having source-drain connections forming a stack between a first node and a supply node, wherein a given logical state on the first node causes a corresponding logical state on an output clock of the clock gater circuit. The plurality of transistors comprises a first transistor having a gate controlled responsive to a clock input of the clock gater circuit and a second transistor having a gate controlled responsive to an output of a delay circuit. The delay circuit comprises at least one inverter, wherein an input of the delay circuit is the clock input, and wherein a first inverter of the delay circuit is coupled to receive a test input signal and is configured to force a first logical state on an output of the first inverter responsive to an assertion of the test input signal. An integrated circuit comprising one or more of the clock gater circuits is also contemplated.

BRIEF DESCRIPTION OF THE DRAWINGS

The following detailed description makes reference to the accompanying drawings, which are now briefly described.

Figure 1:
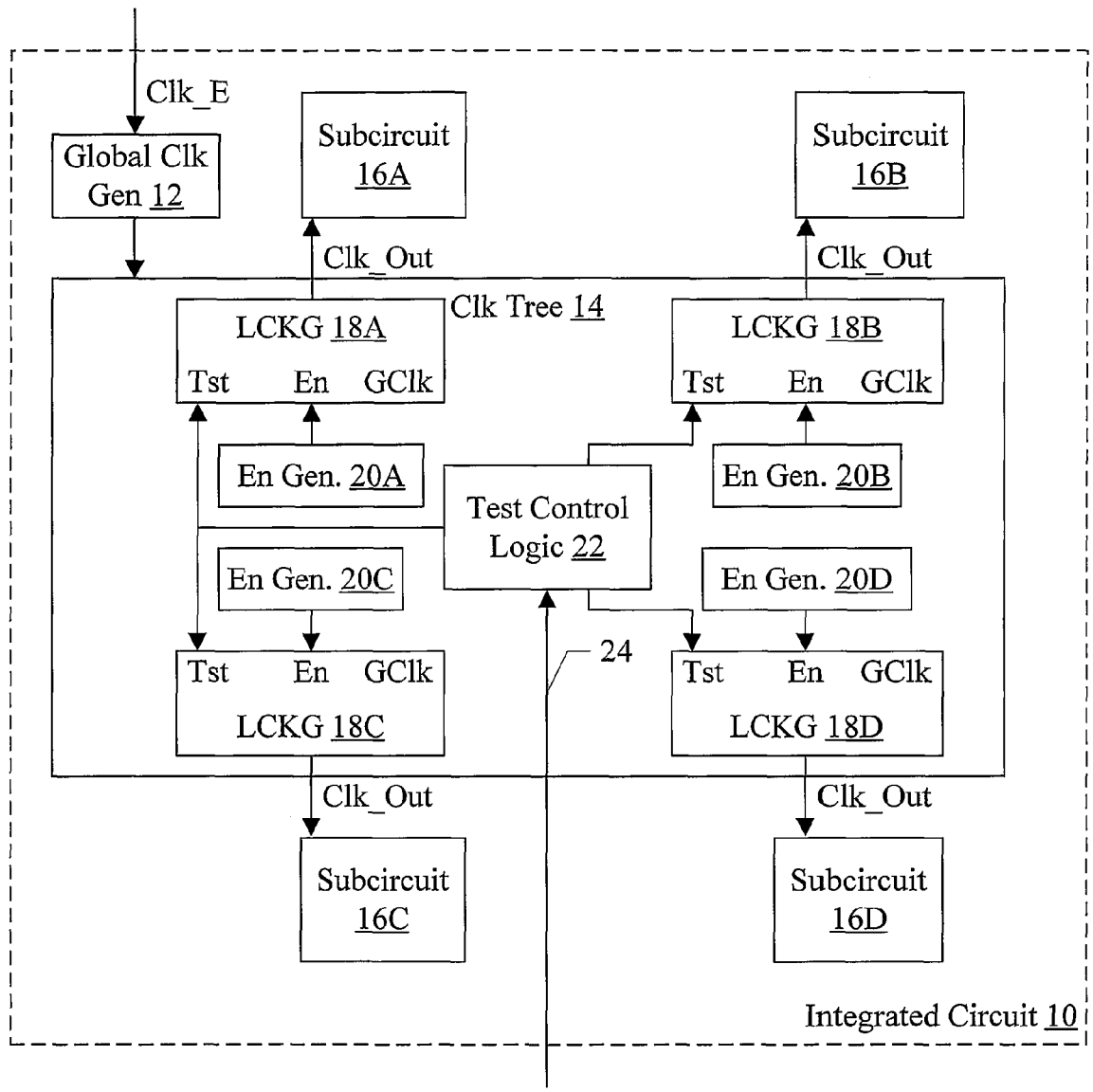
FIG. 1 is a block diagram of one embodiment of an integrated circuit with clock gaters.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Turning now to FIG. 1, a block diagram of one embodiment of an integrated circuit 10 is shown. In the embodiment of FIG. 1, the integrated circuit 10 includes a global clock generation circuit 12, a clock tree 14, and a plurality of subcircuits 16A-16D. The clock generation circuit 12 is coupled to receive an external clock (Clk_E) and generate a global clock to the clock tree 14. The clock tree 14 is coupled to receive the global clock and to provide various local clocks (e.g. various Clk_Out signals to subcircuits 16A-16D, respectively).

A portion of the clock tree 14 is shown in FIG. 1. Specifically, the last level of the clock tree (closest to the circuits receiving the clocks) is shown. Various local clock gaters (LCKGs) 18A-18D are shown, each generating a respective Clk_Out for a corresponding subcircuit 16A-16D. The LCKGs 18A-18D have a global clock input (GClk) that may be coupled to receive a (possibly buffered) global clock being propagated by the clock tree 14. Each LCKG 18A-18D has an enable input (En) that may be generated by the corresponding enable generation logic 20A-20D shown in FIG. 1. While the enable generation logic 20A-20D is shown within the clock tree 14 in FIG. 1, the enable generation logic 20A-20D may receive inputs from the subcircuits 16A-16D (not shown in FIG. 1) and/or may be part of the subcircuits 16A-16D. A given subcircuit 16A-16D may provide signals for generating an enable for that subcircuit and/or for another subcircuit, in various embodiments.

The LCKGs 18A-18D may generate the output clocks conditionally based on the enable input. The enable input may be generated by the enable generation logic 20A-20D, respectively, observing various activity in the corresponding subcircuit and/or other subcircuits 16A-16D, based on whether or not the corresponding subcircuit is to be in use in the next clock cycle. Some clocks may be unconditional, in some embodiments. In such cases, the enable signal may be tied to the asserted state. The LCKG circuitry is still used in this case to minimize delay differences between the unconditional clocks and the conditional local clocks. In other embodiments, the LCLK circuit may not be used for unconditional clocks.

In one embodiment, the enable signal is a logical one if clock generation is enabled and is a logical zero if clock generation is not enabled (e.g. the clock is to be "gated", or "inhibited"). This example may be used in some of the figures described below. In other embodiments, the enable signal may be a logical zero if clock generation is enabled and a logical one if clock generation is not enabled. The enable signal may be referred to as "asserted" if it is in a state indicating that clock generation is enabled, and "deasserted" if it is in a state indicating that clock generation is not enabled. Similarly, various test signals may be referred to as asserted if the corresponding test function is being requested and deasserted if the corresponding test function is not being requested, where assertion and deassertion may be signified by either logical state, as desired. As used herein, a clock is "generated" if the clock oscillates in response to the source clock and is "not generated" or "inhibited" if the clock is held at a steady level (high or low) even though the source clock is toggling.

Furthermore, each LCKG 18A-18D has a test input (Tst) that may comprise one or more test signals. The Tst input may be used to control the LCKGs 18A-18D during testing of the integrated circuit 10. For example, the Tst input may be used to force a LCKG 18A-18D to generate a clock on the Clk_Out output, and/or to force an LCKG 18A-18D not to generate the clock (e.g. inhibit the clock). Different LCKGs 18A-18D may be forced to generate while others are forced to inhibit at the same time. Test control logic 22 is shown coupled to the Tst inputs of the LCKGs 18A-18D. The test control logic 22 may receive input signals from external to the integrated circuit 10 (e.g. arrow 24) and/or internal to the integrated circuit 10 (not shown in FIG. 1) to generate the Tst inputs for the LCKGs 18A-18B. For example, the test control logic 22 may be controlled by a test access port (TAP) such as the one specified in the Institute for Electronic and Electrical Engineers (IEEE) 1149.1 standard, or any other test mechanism.

The ability to force a given clock to be generated (i.e. toggling according to the clock input) during testing may simplify the testing of the integrated circuit, since the test patterns need not ensure that the enable is asserted if the clock is to be generated for the test. On the other hand, the ability to force a given clock to be inhibited (i.e. holding steady at a given level, which may be high or low as desired) may mitigate di/dt effects on the testing by limiting the switching in subcircuits 16A-16D that are not involved in the test.

The test control logic 22 may provide separate test signals to each LCKG 18A-18D, group two or more LCKGs 18A-18D to provide the same test signals (or logically the same signals, even if the physical wiring differs), or a combination of the above.

The clock generation circuit 12 is configured to generate the global clock from the external clock CLK_E for use by the circuitry illustrated in FIG. 1. The clock generation circuit 12 may include, for example, a phase locked loop (PLL) for locking the phase of the global clock to the external clock. The PLL or other clock generation circuitry may multiply or divide the frequency of the external clock to arrive at the frequency of the global clock. Any desired clock generation circuitry may be used.

The global clock is provided to the clock tree 14. The clock tree 14 buffers the global clock for distribution to the various loads in the integrated circuit 10 (e.g. the various subcircuits 16A-16D). In some embodiments, the LCKGs 18A-18D may not be the lowest level of the clock tree 14 (e.g. there may be buffering between the Clk_Out outputs of the LCKGs 18A-18D and the various loads in the corresponding subcircuits 16A-16D).

The subcircuits 16A-16D may generally provide the functionality that the integrated circuit 10 is designed to perform. For example, if the integrated circuit 10 includes a processor, subcircuits may include fetch logic, issue logic, and execution units of various types (e.g. integer, floating point, load/store, etc.). The integrated circuit 10 may include various interface circuits (e.g. network interfaces, standard I/O interfaces such as peripheral component interconnect (PCI), HyperTransport™, etc.); and each interface circuit may comprise one or more subcircuits. The integrated circuit 10 may include caches or cache controllers, which may comprise one or more subcircuits, and/or a memory controller which may comprise one or more subcircuits. Any functionality may be included in various embodiments.

Figure 2:
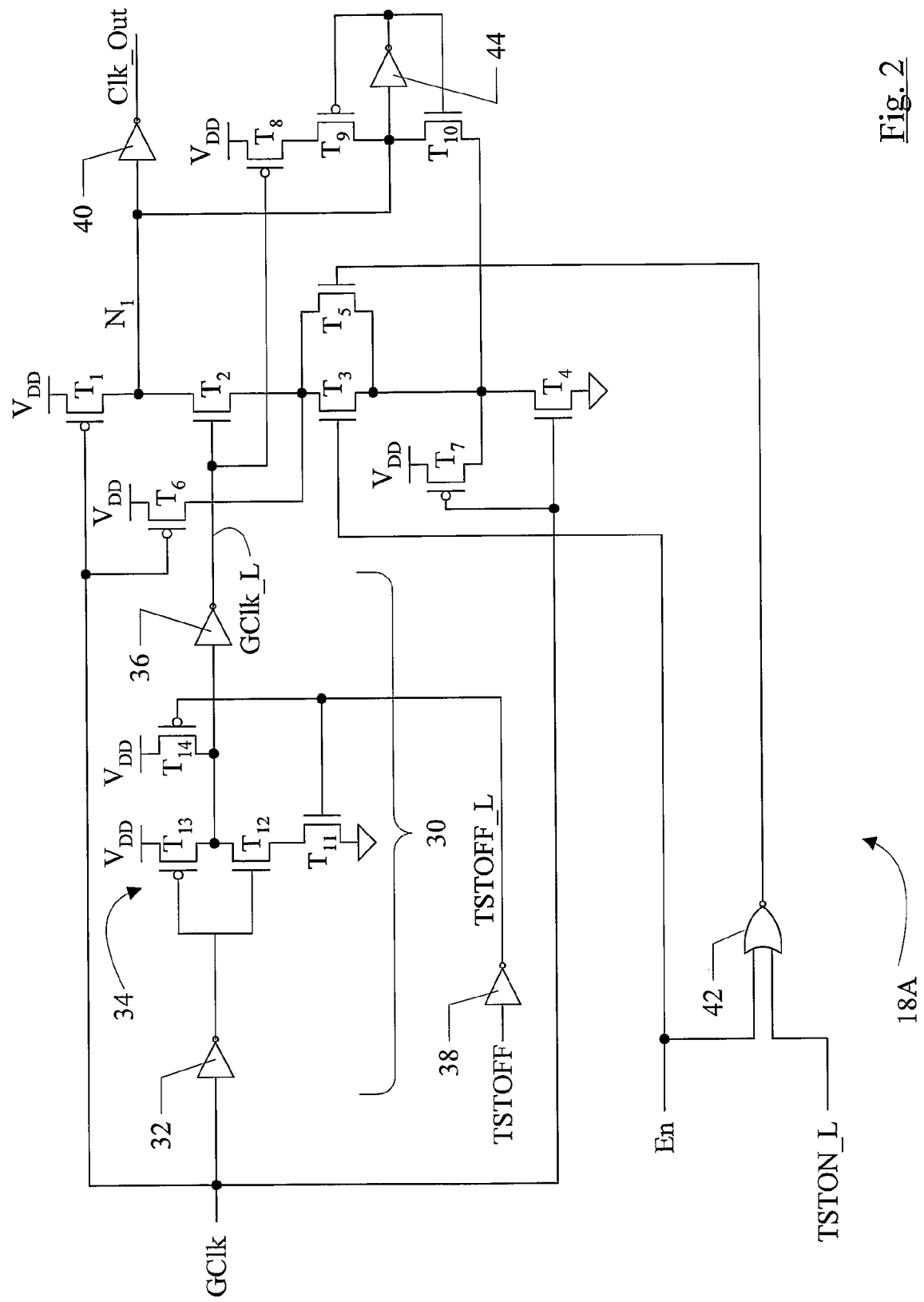
FIG. 2 is a circuit diagram of one embodiment of a clock gater.

Turning now to FIG. 2, a circuit diagram of one embodiment of the LCKG 18A is shown. Other LCKGs 18B-18D may be similar. In FIG. 2, signals that are asserted low have the suffix "_L" added to the signal name. Signals without the "_L" suffix may be asserted high. Other embodiments may define the signals differently. In the illustrated embodiment, the Tst input of the LCKG 18A comprises a TSTON_L signal and a TSTOFF signal. The TSTON_L signal may be asserted (low, binary zero) to force the LCKG 18A to generate the Clk_Out output. The TSTOFF signal may be asserted (high, binary one) to inhibit clock generation. Also shown in FIG. 2 are the GClk and En inputs, and the Clk_Out output clock.

The transistors shown in FIG. 2 may be N-type metal-oxide-semiconductor (NMOS) or P-type MOS (PMOS) transistors, using the standard notation for such transistors in which the PMOS transistor has an open circle on its gate and the NMOS transistor has no open circle on its gate. Thus, in the illustrated embodiment, the transistors $T_1$, $T_6$, $T_7$, $T_8$, $T_9$, $T_{13}$, and $T_{14}$ are PMOS transistors and the transistors $T_2$, $T_3$, $T_4$, $T_5$, $T_{10}$, $T_{11}$, and $T_{12}$ are NMOS transistors.

The GClk input is coupled as an input to a delay circuit 30 that comprises inverters. Generally, the delay circuit 30 may comprise one or more inverters connected in series. The number of inverters is odd, in this embodiment. For example, three inverters are shown in FIG. 2 (inverters 32, 34, and 36). Inverter 34 is shown in greater detail, and is coupled to receive a TSTOFF_L input in addition to its series input from inverter 32. The TSTOFF_L signal is generated by inverter 38, from the TSTOFF signal. Additional description of the inverter 36 is provided further below. The output of the delay circuit 30 is the GClk_L signal shown in FIG. 2.

A plurality of transistors having source-drain connections forming a stack between a node and a supply node provide the clock gating in this embodiment, based on the state of the enable input signal. In the illustrated embodiment, the transistors $T_2$, $T_3$, and $T_4$ form the stack. In general, the transistors that form the stack include a transistor with its drain coupled to the node (e.g. $T_2$ with its drain connected to the node $N_1$), and then respective source-drain connections of the transistors until the last transistor (e.g. $T_4$) has its source coupled to the supply node. In this embodiment, the supply node is the ground reference. In other embodiments, the supply node may be the power supply node. Generally, a supply node may be any node that is designed to have a steady voltage during use (although there may be temporary variations in the voltage, such as ground bounce or power supply droop).

The node $N_1$ controls the output clock Clk_Out in FIG. 2. That is, a given logical state on the node $N_1$ causes a corresponding logical state on the output clock. For example, in the illustrated embodiment, the node $N_1$ is an input to the inverter 40, which drives Clk_Out. Thus, the complement of each logical state on the node $N_1$ is the corresponding state on Clk_Out. In other embodiments, a non-inverting buffer (e.g. an even number of inverters) may be used and the same logical state as the node $N_1$ may be the corresponding state on Clk_Out.

The source of $T_2$ is connected to the drain of $T_3$, which has its source connected to the drain of $T_4$. Accordingly, the stack (in the absence of operation of other transistors that may be connected to nodes of the stack) comprises a series connection. During the clock phase that the stack evaluates (in normal operation), other transistors connected to nodes in the stack may be inactive. For example, in the illustrated embodiment, the $T_2$ to $T_4$ stack may evaluate during the high phase of the GClk input. Specifically, $T_4$ may activate in response to the rising edge of the GClk input (since the gate of $T_4$ is connected to the GClk input). For a time period corresponding to the delay of the delay circuit 30, the GClk_L signal output from the delay circuit 30 is also high, before transitioning low in response to the rising edge of the GClk input. The gate of $T_2$ is connected to GCLK_L, and thus is active at the time $T_4$ is activated. Accordingly, the delay of the delay circuit 30 may create a window of the high phase of the GClk clock during which the enable signal En (connected to the gate of $T_3$) can affect the output of the LCKG 18A. Specifically, if the En signal is asserted, the transistor $T_3$ activates and the node $N_1$ may be discharged. The Clk_Out may thus transition high. On the other hand, if the enable input is not asserted, the transistor $T_3$ is not activated and the node $N_1$ is not discharged. The node $N_1$ remains at the high state (and the Clk_Out signal at the low state) until the enable is asserted. During the low phase of the GClk input, the transistor $T_1$ (having its drain connected to node $N_1$, source connected to the $V_{DD}$ supply, and gate connected to the GClk input) charges the node $N_1$, creating the low phase of the Clk_Out signal.

Accordingly, the setup time of the enable input may be controlled by the delay circuit 30 and the amount of time needed to reliably discharge the node $N_1$. Alternatively, the setup time may be based on the edge of the GClk signal. The hold time may also be determined by the delay, and may be relatively small as compared to the length of a clock phase. Accordingly, a low setup time and hold time for the enable may be achieved.

To provide the testability feature of ensuring that the Clk_Out is generated if the TSTON_L signal is asserted, the transistor $T_5$ is connected in parallel with $T_3$. The gate of $T_5$ is controlled responsive to the TSTON_L signal. In this embodiment, the gate of $T_5$ is connected to the output of a NOR gate 42. The inputs to the NOR gate 42 are the enable input and the TSTON_L signal. If the enable input is deasserted and the TSTON_L signal is asserted, the output of the NOR gate 42 is a logical one and the transistor $T_5$ activates, causing the stack to discharge the node $N_1$ during the window even though the enable is not asserted. If the enable is asserted, the output of the NOR gate 42 is a logical zero and $T_5$ is not activated. However, in this case, $T_3$ is activated and thus the Clk_Out is still generated. Using the NOR gate to deactivate $T_5$ if $T_3$ is activated may ensure that test operation is approximately the same as normal (non-test) operation. That is, one of $T_3$ or $T_5$ may be activated, but not both. If $T_3$ and $T_5$ are sized the same, the test operation (e.g. speed of discharge) may be approximately the same as the normal operation. Accordingly, accuracy of "at speed" testing may be provided. In other embodiments, the $T_5$ may be directly controlled by the TSTON signal.

The operation of the stack $T_2$ to $T_4$ may also vary a small amount based on the initial voltage of each internal node of the stack. To provide more consistent operation, a transistor may be connected to each internal node. For example, the transistor $T_6$ connected to the node between $T_2$ and $T_3$, and the transistor $T_7$ connected to the node between $T_3$ and $T_4$. The gates of $T_6$-$T_7$ may be controlled by the GClk input, and may precharge the nodes during the non-evaluation phase of the GClk input (e.g. the low phase in this embodiment). The transistors $T_6$-$T_7$ may not be included in other embodiments.

Since the stack $T_2$ to $T_4$ operates during a window of the high phase of the GClk, the LCKG 18A may include a storage circuit to capture the value of the node $N_1$ and hold the value during the remainder of the high phase outside of the stack evaluation window. The storage circuit in FIG. 2 comprises the inverter 44, cross coupled with an inverter formed from transistors $T_9$ and $T_{10}$. The transistor $T_8$ has its gate coupled to the GClk_L signal and is coupled between the $T_9$ drain and the power supply. During the time that the $T_2$ to $T_4$ stack evaluates, the GClk_L signal is high and the transistor $T_8$ may disable the pullup of the $T_9$-$T_{10}$ inverter. During the remainder of the GClk high phase, the GClk_L signal transitions low and $T_8$ is active, allowing the pullup to retain a high state on the node $N_1$ if that is the state that was captured by the inverter 44. The transistor $T_4$ (coupled between the source of $T_{10}$ and ground) may be used to prevent the pulldown through $T_{10}$, if a low state of the node $N_1$ was captured, during the low phase of the GClk input (when the transistor $T_1$ is charging the node $N_1$).

As mentioned previously, if the TSTOFF input is asserted, the Clk_Out is to be inhibited. In this embodiment, the Clk_Out clock may be held at a low state. Other embodiments may hold the output steady at the high state. In order to hold Clk_Out at a low state, the node $N_1$ is held at a high state, via the transistor $T_1$ in the low phase of the GClk input and $T_8$-$T_9$ during the high phase. Accordingly, the GClk_L signal is to be held low, independent of the GClk input. In this embodiment, the GClk_L signal is held low via the inverter 34 and the TSTOFF input.

Specifically, the transistors $T_{12}$ and $T_{13}$ are connected in an inverter configuration, with their gates connected to the output of the inverter 32 and their drains connected to the output node of the inverter 34 (which is also the input of the inverter 36). The transistors $T_{14}$ and $T_{11}$ are also provided, having their gates connected to the TSTOFF_L signal. The transistor $T_{14}$ is in parallel with the transistor $T_{13}$, and the transistor $T_{11}$ is in series with the transistor $T_{12}$. If the TSTOFF signal is deasserted (and thus the TSTOFF_L signal is high), the transistor $T_{14}$ is inactive and the transistor $T_{11}$ is active, and thus the inverter 34 operates as usual in response to the input to the inverter. If the TSTOFF signal is asserted (and thus the TSTOFF_L signal is low), the transistor $T_1$ is inactive and thus blocks the transistor $T_{12}$ from discharging the output node. The transistor $T_{14}$ is active if the TSTOFF signal is asserted, pulling up the output of the inverter 34 (and thus holding the GClk_L signal low).

While the inverter 34 pulls up its output in response to assertion of the TSTOFF signal, other embodiments may use an inverter that pulls the output low (e.g. the inverter 32 or 36 could be designed in such fashion, in the embodiment of FIG.

Figure 3:
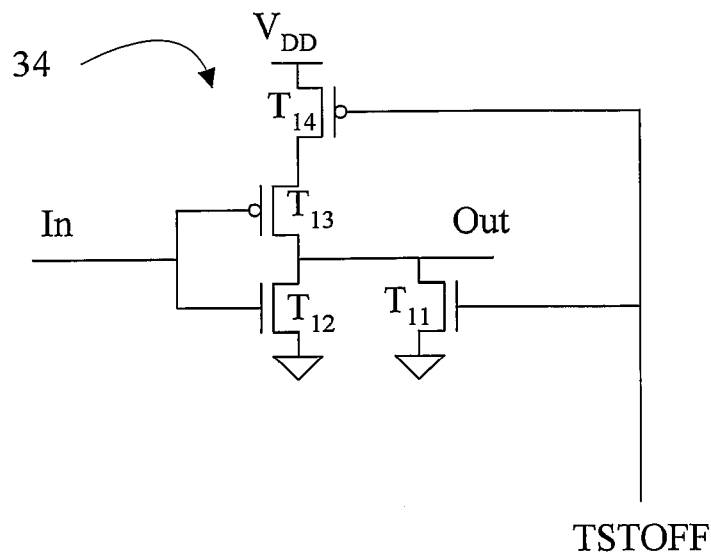
FIG. 3 is a circuit diagram of another embodiment of an inverter with a test input signal that is shown in FIG. 2.

2). In such an embodiment, the transistor $T_{14}$ would be placed in series with $T_{13}$ and the transistor $T_{11}$ would be in parallel with $T_{12}$. Additionally, the inverter 38 would be eliminated. An example of such an embodiment is shown in FIG. 3. It is further noted that the transistors $T_{13}$ and $T_{12}$ may represent series stacks of transistors (e.g. to better control the delay of the delay circuit 30 over wide operating voltages, temperatures, and process conditions). Accordingly, an inverter that also receives the TSTOFF signal may comprise at least one transistor in parallel with a first one or more transistors that generate a first state on the output of the inverter and at least one transistor in series with a second one or more transistors that generate a second state on the output of the inverter.

Figure 4:
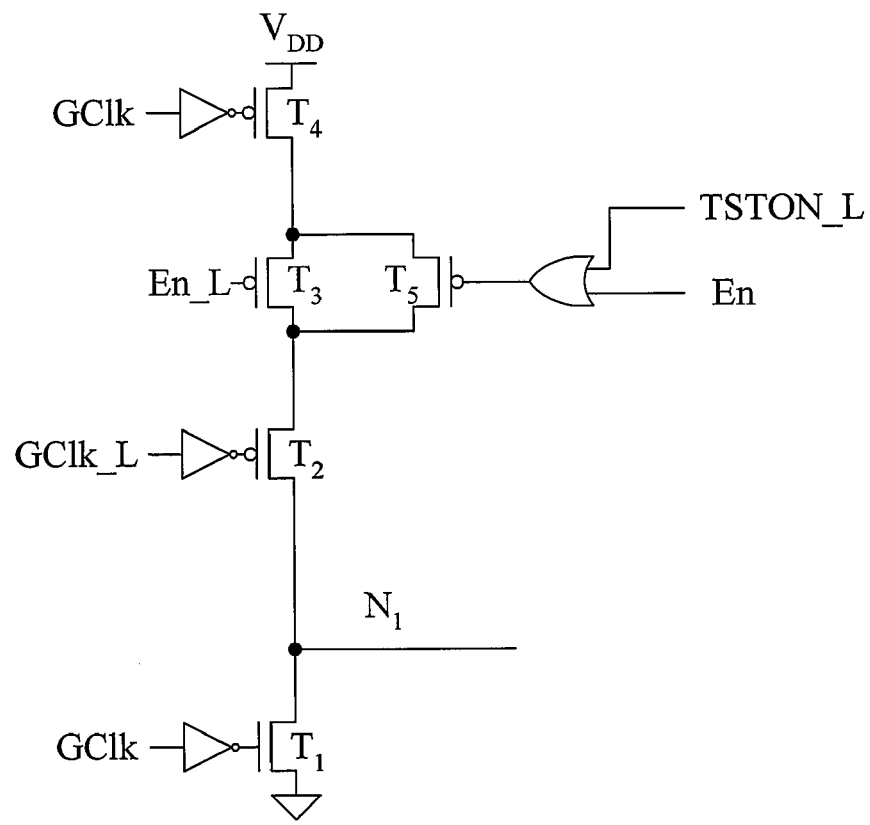
FIG. 4 is a circuit diagram of another embodiment of a clock gater stack shown in FIG. 2.

It is noted that, in other embodiments, the stack $T_2$ to $T_4$ may be provided to conditionally charge the node $N_1$ (e.g. the stack may be PMOS transistors connected between the node $N_1$ and the power supply node). In such an embodiment, the transistor $T_1$ would be an NMOS transistor that "precharges" the node $N_1$ to ground. FIG. 4 is an example of such embodiment that generates or inhibits the output clock in the high phase of GClk. Other embodiments may operate during the low phase of GClk, without the inverters on GClk and GClk_L shown in FIG. 4.

It is further noted that, while the illustrated embodiment is a non-inverting LCKG 18A in which the high phase of the GClk corresponds to a high phase of Clk_Out (and vice versa), inverting LCKGs are also contemplated. Inverting LCKGs may comprise an additional inverter on the input of the LCKG (producing the GClk as shown in FIG. 2), or may comprise an additional inverter on the output, in some embodiments. It is further noted that additional input buffering may be provided, if desired, in some embodiments.

Numerous variations and modifications will become apparent to those skilled in the art once the above disclosure is fully appreciated. It is intended that the following claims be interpreted to embrace all such variations and modifications.

What is claimed is:

1. A clock gater circuit comprising:
a plurality of transistors having source-drain connections forming a stack between a first node and a supply node, wherein a given logical state on the first node causes a corresponding logical state on an output clock of the clock gater circuit, and wherein a first transistor of the plurality of transistors has a gate coupled to receive an enable input signal; and
a second transistor connected in parallel with the first transistor, the second transistor having a gate controlled responsive to a test input signal to ensure that the output clock is generated even if the enable input signal is not in an enabled state, wherein the second transistor connection in parallel with the first transistor includes the source and drain of the second transistor being connected to the source and drain of the first transistor, respectively.

2. The clock gater circuit as recited in claim 1 wherein the plurality of transistors are N-type metal-oxide semiconductor (NMOS) transistors and the supply node is a ground reference for the circuit.

3. The clock gater circuit as recited in claim 1 wherein the plurality of transistors are P-type metal-oxide semiconductor (PMOS) transistors and the supply node is a power supply for the circuit.

4. The clock gater circuit as recited in claim 1 further comprising a second plurality of transistors, wherein each transistor is connected to a different node in the stack, and wherein the second plurality of transistors are configured to provided a consistent initial voltage on each node prior to the stack evaluating.

5. The clock gater circuit as recited in claim 1 further comprising a delay circuit comprising at least one inverter, wherein an input of the delay circuit is the clock input, and wherein the plurality of transistors comprises a third transistor having a gate controlled responsive to the clock input of the clock gater circuit and a fourth transistor having a gate controlled responsive to an output of the delay circuit.

6. The clock gater circuit as recited in claim 5 wherein a first inverter of the delay circuit comprises at least a fifth transistor in parallel with a first one or more transistors that generate a first logical state on an output of the first inverter, and wherein the first inverter further comprises at least a sixth transistor in series with a second one or more transistors that generate a second logical state on the output of the first inverter, and wherein the fifth and sixth transistors are controlled responsive to a second test input signal to the clock gater circuit.

7. The clock gater circuit as recited in claim 6 wherein, if the second test signal is asserted during use, the fifth and sixth transistors force the first logical state onto the output of the inverter.

8. The clock gater circuit as recited in claim 6 wherein the delay circuit comprises a plurality of inverters in series, including the first inverter.

9. The clock gater circuit as recited in claim 8 wherein a number of the plurality of inverters is odd.

10. A clock gater circuit comprising:
a plurality of transistors having source-drain connections forming a stack between a first node and a supply node, wherein a given logical state on the first node causes a corresponding logical state on an output clock of the clock gater circuit, and wherein a first transistor of the plurality of transistors has a gate coupled to receive an enable input signal;
a second transistor connected in parallel with the first transistor, the second transistor having a gate controlled responsive to a test input signal to ensure that the output clock is generated even if the enable input signal is not in an enabled state; and
a storage circuit coupled to the first node wherein the storage circuit is configured to capture a value on the first node.

11. The clock gater circuit as recited in claim 10 wherein at least two of the plurality of transistors have gates controlled responsive to a clock input to the clock gater circuit, wherein the operation of the at least two transistors creates a window during a first phase of the input clock during which the enable input can affect the value on the first node, and wherein the storage circuit is configured to retain the value for a remainder of the first phase outside of the window.

12. An integrated circuit comprising a plurality of subcircuits and a plurality of clock gater circuits, wherein each of the plurality of subcircuits is coupled to receive an output clock from at least one of the clock gater circuits, and wherein each of the plurality of clock gater circuits comprises:
a plurality of transistors having source-drain connections forming a stack between a first node and a supply node, wherein a given logical state on the first node causes a corresponding logical state on an output clock of the clock gater circuit, and wherein a first transistor of the plurality of transistors has a gate coupled to receive an enable input signal; and
a second transistor connected in parallel with the first transistor, the second transistor having a gate controlled responsive to a test input signal to ensure that the output clock is not gated even if the enable input signal is not in an enabled state, wherein the second transistor connection in parallel with the first transistor includes the source and drain of the second transistor being connected to the source and drain of the first transistor, respectively.

13. The integrated circuit as recited in claim 12 wherein each of the plurality of clock gater circuits further comprises a delay circuit comprising at least one inverter, wherein an input of the delay circuit is the clock input, and wherein the plurality of transistors comprises a third transistor having a gate controlled responsive to the clock input of the clock gater circuit and a fourth transistor having a gate controlled responsive to an output of the delay circuit.

14. The integrated circuit as recited in claim 13 wherein a first inverter of the delay circuit comprises at least a fifth transistor in parallel with a first one or more transistors that generate a first logical state on an output of the first inverter, and wherein the first inverter further comprises at least a sixth transistor in series with a second one or more transistors that generate a second logical state on the output of the first inverter, and wherein the fifth and sixth transistors are controlled responsive to a second test input signal to the clock gater circuit.

15. The integrated circuit as recited in claim 12 further comprising a second plurality of transistors, wherein each transistor is connected to a different node in the stack, and wherein the second plurality of transistors are configured to provided a consistent initial voltage on each node prior to the stack evaluating.

* * * * *

UNITED STATES PATENT AND TRADEMARK OFFICE
CERTIFICATE OF CORRECTION

PATENT NO.        : 7,779,372 B2
APPLICATION NO.   : 11/627646
DATED             : August 17, 2010
INVENTOR(S)       : Brian J. Campbell et al.

It is certified that error appears in the above-identified patent and that said Letters Patent is hereby corrected as shown below:

In column 5, line 29, delete "GCLK_L" and insert -- GClk_L --, therefor.

In column 6, line 59, delete "$T_1$" and insert -- $T_{11}$ --, therefor.

Signed and Sealed this
Fifteenth Day of November, 2011

David J. Kappos
*Director of the United States Patent and Trademark Office*